(12) United States Patent
Lien et al.

(10) Patent No.: US 11,417,532 B2
(45) Date of Patent: Aug. 16, 2022

(54) METHOD FOR REDUCING MISMATCH OF SEMICONDUCTOR ELEMENT PATTERNS

(71) Applicant: UNITED MICROELECTRONICS CORP., Hsin-Chu (TW)

(72) Inventors: Hung-Kang Lien, Kaohsiung (TW); Wei-Cheng Hung, New Taipei (TW); Yu-Jen Liu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/159,183

(22) Filed: Jan. 27, 2021

(65) Prior Publication Data

US 2022/0199408 A1 Jun. 23, 2022

(30) Foreign Application Priority Data

Dec. 23, 2020 (TW) ................. 109145637

(51) Int. Cl.
| | | |
|---|---|---|
| *H01L 21/308* | (2006.01) | |
| *G06F 30/392* | (2020.01) | |
| *H01L 29/78* | (2006.01) | |
| *H01L 21/8234* | (2006.01) | |
| *H01L 29/66* | (2006.01) | |
| *H01L 21/8238* | (2006.01) | |

(52) U.S. Cl.
CPC .......... *H01L 21/308* (2013.01); *G06F 30/392* (2020.01); *H01L 21/823412* (2013.01); *H01L 21/823418* (2013.01); *H01L 21/823807* (2013.01); *H01L 21/823814* (2013.01); *H01L 29/66636* (2013.01); *H01L 29/7848* (2013.01)

(58) Field of Classification Search
None
See application file for complete search history.

(56) References Cited

U.S. PATENT DOCUMENTS 9,646,889 B1 * 5/2017 Yu ................... H01L 21/823871
9,818,745 B2 11/2017 Lee

OTHER PUBLICATIONS

G. Eneman et al., Scalability of the Si1-xGex Source/Drains Technology for the 45nm Technology Node and Beyond, IEEE Transaction on Electron Devices, vol. 53, pp. 1647-1656. (Year: 2006).*
Yang, title: High Performance Mobile SoC Design and Technology Co-Optimization to Mitigate High-K Metal Gate Process Induced Variations, 2014.

* cited by examiner

*Primary Examiner* — Jiong-Ping Lu
(74) *Attorney, Agent, or Firm* — Winston Hsu

(57) ABSTRACT

The invention provides a method for reducing mismatch of semiconductor device patterns, which comprises the following steps: defining an initial lithography area which partially overlaps a target gate structure, a first gate structure and a second gate structure; if a length and a width of the target gate structure are smaller than a preset channel length and a preset channel width respectively, adjusting and reducing the area of the initial lithography area to define a second lithography area. The second lithography area partially overlaps with the target gate structure but does not overlap with the first gate structure and the second gate structure, and the second lithography region is defined as the active area.

5 Claims, 2 Drawing Sheets

METHOD FOR REDUCING MISMATCH OF SEMICONDUCTOR ELEMENT PATTERNS

BACKGROUND OF THE INVENTION

1. Field of the Invention

The present invention relates to the field of semiconductor manufacturing processes, in particular to a method for reducing the pattern mismatch of semiconductor devices.

2. Description of the Prior Art

With the development of semiconductor manufacturing process, the size of semiconductor devices is getting smaller and smaller, which means that more semiconductor devices can be formed on the wafer, and the semiconductor devices are closely arranged to improve the density of devices.

However, the applicant found that when the size of semiconductor devices is reduced to a certain size, the characteristics (such as current characteristics) of one semiconductor device will be more easily affected by the manufacturing process. For example, after the epitaxial process, the turn-on current (Ion) of semiconductor devices may change greatly, which is not conducive to controlling the accuracy of devices and may reduce the process yield. The above situation is generally also referred to as "mismatch". Taking the applicant's experimental results as an example, please refer to FIG. 1 and FIG. 2. FIG. 1 shows a schematic layout diagram of a semiconductor device in a unit area, and FIG. 2 shows an average turn-on current diagram of the semiconductor device shown in FIG. 1 before and after forming an epitaxial layer under different channel length. As shown in FIG. 1, the substrate 10 includes an active area 12 (or a diffusion region) formed in the substrate 10, and a plurality of parallel gate structures 14, such as polysilicon structures, are formed on the substrate 10 and spanning part of the active area 12.

As shown in FIG. 2, in which the horizontal axis of FIG. 2 represents the channel length and the vertical axis represents the average measured turn-on current (Ion) of the semiconductor device, the applicant found that when the channel length is reduced to the range of about 0.1 μm to 0.5 μm, and if the active area 12 overlaps with a plurality of gate structures, the difference value of turn-on current measured by the semiconductor device between before forming and after forming the epitaxial layer of the semiconductor device is increased. Therefore, it is not conducive to the control of the subsequent semiconductor device manufacturing process.

SUMMARY OF THE INVENTION

One of the purposes of the present invention is to propose a method to solve the mismatch problem of semiconductor devices.

The invention provides a method for reducing the mismatch of semiconductor device patterns, which includes the following steps: providing a substrate on which a plurality of mutually parallel gate structures are formed, the plurality of gate structures at least comprise a target gate structure and a first gate structure and a second gate structure which are respectively positioned at two sides of the target gate structure, defining an active area in a computer system. The method for defining the active area includes: defining an initial lithography area partially overlapping the target gate structure, the first gate structure and the second gate structure, if a length and a width of the target gate structure are smaller than a channel length preset value and a channel width preset value respectively, adjusting and reducing the area of the initial lithography area to define a second lithography area partially overlapping the target gate structure, but not overlapping with the first gate structure and the second gate structure, defining the second lithography area as the active area, and performing an etching step to transfer the pattern of the active area into the substrate to form a groove in the substrate.

In the method of the present invention, the size of the target gate structure in the semiconductor device is determined, and if the size of the target gate structure is within a specific range, it is easy to generate a mismatch issue (ΔIon is larger). Therefore, in order to avoid the above mismatch issue, the present invention will adjust the size of the active area, especially if the active area only partially overlaps with the target gate structure and does not overlap with other adjacent gate structures (the first gate structure and the second gate structure), it can effectively reduce the mismatch issue (the current difference before and after forming the epitaxial layer is large) of the semiconductor device. Therefore, the yield of semiconductor devices can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
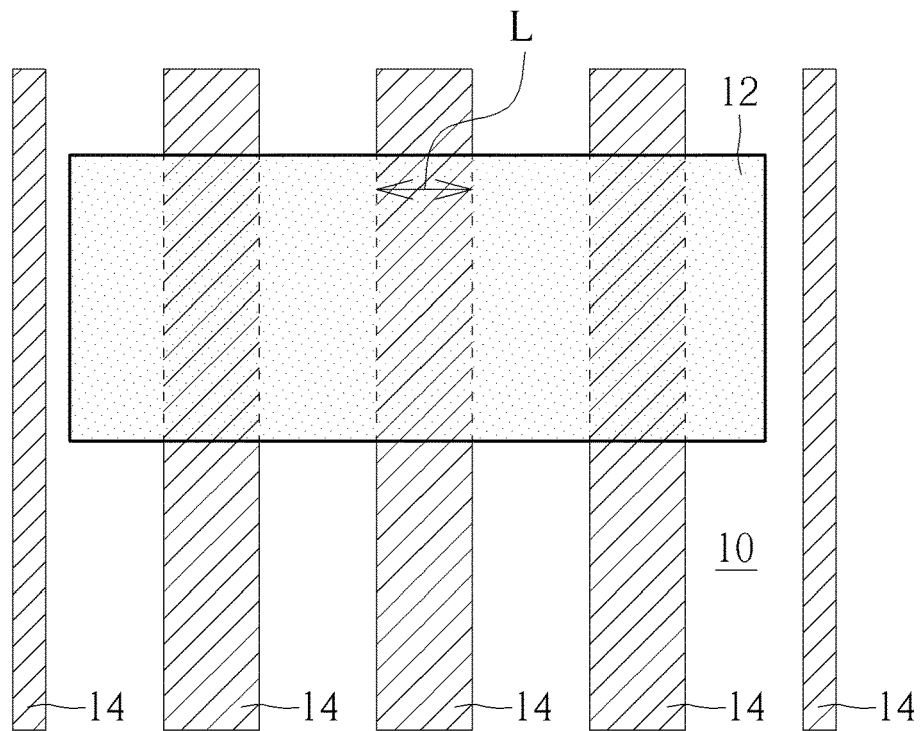
FIG. 1 is a schematic diagram showing the layout of the semiconductor device per unit area.
Figure 2:
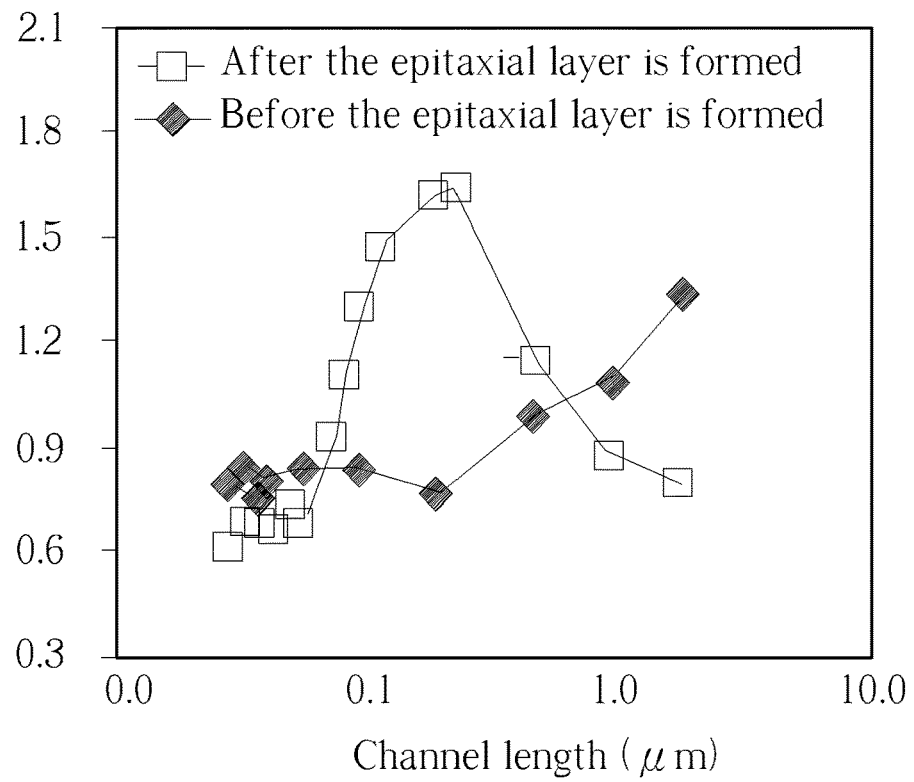
FIG. 2 is a schematic diagram showing the turn-on current difference of the semiconductor device before and after forming an epitaxial layer under different channel length in shown FIG. 1.
Figure 3:
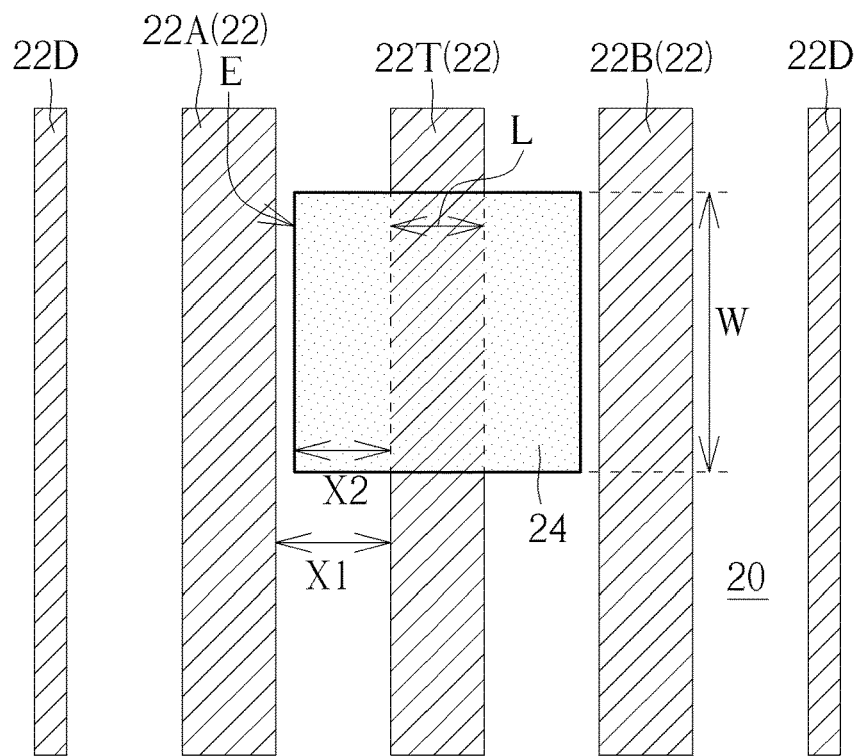
FIG. 3 is a schematic diagram showing the layout of semiconductor devices after adjusting the active area in a unit area.
Figure 4:
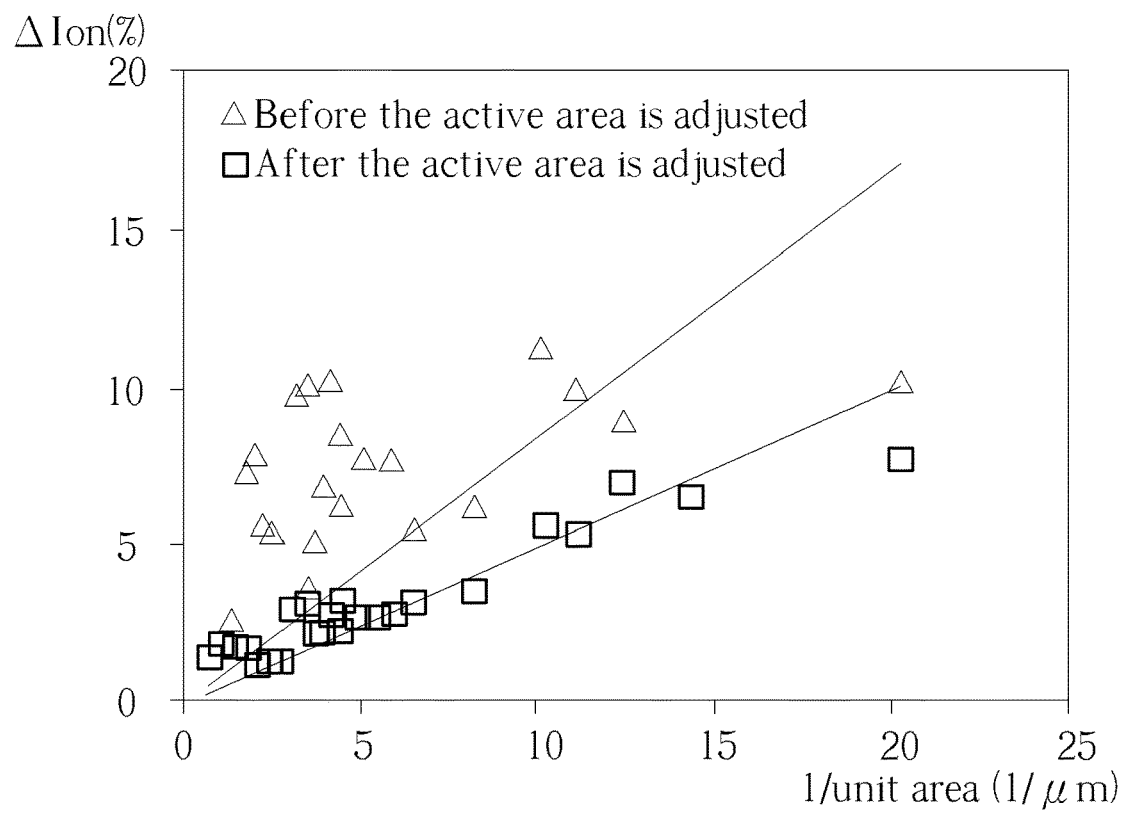
FIG. 4 shows the difference of the turn-on current (ΔIon) before and after forming the epitaxial layer in the unit area of the semiconductor device shown in FIG. 1 and FIG. 3.

Please refer to FIG. 3 and FIG. 4. FIG. 3 shows a schematic layout diagram of a semiconductor device after adjusting the active area in a unit area, and FIG. 4 shows a turn-on current difference (ΔIon) diagram before and after forming an epitaxial layer in a different semiconductor device shown in FIG. 1 and FIG. 3 in a unit area. As shown in FIG. 3, a substrate 20 is provided, such as, but not limited to, a silicon substrate, a silicon germanium substrate, a silicon carbide substrate, a silicon-on-insulator, SOI) substrate, or a substrate made of other semiconductor materials. A substrate 20 is formed with a plurality of gate structures 22 arranged in parallel with each other, such as a polysilicon structure. The substrate 20 and the gate structure 22 described here are known in the art, and will not be described in detail here. And the target gate structure 22T spans an active area 24.

In this embodiment, the plurality of gate structures 22 may include a target gate structure 22T, a first gate structure 22A and a second gate structure 22B located on two sides (e.g., left and right sides) of the target gate structure 22T, and may include dummy gate structures 22D located outside the first gate structure 22A and the second gate structure 22B. The active area 24 may include an ion doped region, and an epitaxial layer may be formed in a part of the active area (e.g., the active area not covered by the gate structure) in a subsequent step.

In this embodiment, before forming the target gate structure 22T, it is determined whether the size of the target gate structure 22T is within a specific range, and to adjust the size of the active area 24 according to the determination result. According to the experimental results of the applicant, as shown in FIG. 3, if the channel length L of the target gate structure 22T is between 0.1 μm and 0.5 μm, and the channel width W is between 0.5 μm and 3 μm, and if the active area 24 overlaps with a plurality of gate structures (such as the target gate structure 22T, the first gate structure 22A and the second gate structure 22B) at the same time, the measured mismatch issue is more obvious.

In order to reduce the above-mentioned mismatch issue, in this embodiment, before forming the target gate structure 22T and the active area 24, the dimensions of the target gate structure 22T are measured, especially the channel length L and the channel width W. If the channel length L and the channel width W are not within the above-mentioned specific range (for example, the channel length L is between 0.1 μm and 0.5 μm and the channel width W is between 0.5 μm and 3 μm), the subsequent adjustment steps can be omitted, and the active area 24 and each gate structure 22 are directly formed on the substrate 20. In other words, the pattern of an initial active area (the active area without area adjustment) can be directly output as a mask, and the initial active area can be formed in the substrate 20.

On the other hand, if at least one of the channel length L and the channel width W is within the above specific range, as described above, the difference of the turn-on current (ΔIon) of the semiconductor device before and after forming the epitaxial layer will become larger. Therefore, it is necessary to perform an adjustment step to reduce the area of the active area. It is worth noting that the adjustment step is carried out in a computer system, for example, the size of the active area is adjusted in the computer, and then the pattern of the active area is then transferred to the substrate by a mask.

In an embodiment of the present invention, the adjustment step including: the active area before adjustment partially overlaps with the active gate structure 22T, the first gate structure 22A and the second gate structure 22B, and the size of the original active area before adjustment is reduced so that the adjusted active area 24 only overlaps with the target gate structure 22T, but does not overlap with the first gate structure 22A or the second gate structure 22B.

Taking this embodiment as an example, the distance between the target gate structure 22T and the adjacent first gate structure 22A is about 0.12 μm (distance X1 labeled in FIG. 3), and after the adjustment step, the distance between the boundary E of the active area 24 and the boundary of the target gate structure 22 is about 0.95 μm. That is, the active area 24 does not overlap with the first gate structure 22A. In addition, since the layout pattern is symmetrical, the active area 24 does not overlap with the second gate structure 22B on the other side.

Then, after a groove (not shown) is formed in the active area 24 at a position not covered by the target gate structure 22T, an epitaxial layer (not shown) is continuously formed in the groove. The epitaxial layer corresponds to the original active area 24, so the epitaxial layer will not contact the first gate structure 22A and the second gate structure 22B. In this embodiment, the material of the epitaxial layer is, but not limited to, silicon germanium (SiGe). In addition, it should be noted that in this embodiment, no other gate structure is included between the target gate structure 22T and the first gate structure 22A, and similarly, no other gate structure is included between the target gate structure 22T and the second gate structure 22B.

According to the applicant's experimental results, after adjusting the area of the active area 24, it is beneficial to reduce the turn-on current difference (ΔIon) of the semiconductor device before and after forming the epitaxial layer. The results in FIG. 4 respectively plot the turn-on current difference (ΔIon) before and after forming the epitaxial layer, for semiconductor devices with no active area adjusted and semiconductor devices with active area adjusted, on the premise that the channel length L and channel width W of the target gate structure fall within a specific range. In FIG. 4, the horizontal axis is the reciprocal of unit area (1/unit area), and the vertical axis represents ΔIon. As can be seen from FIG. 4, when the active area is adjusted and reduced, ΔIon decreases obviously, and the relationship between experimental data of each group is closer to linearity (as shown in FIG. 4, the slope of the regression line decreases after adjusting the active area, and each group of data is closer to the regression line). That is to say, adjusting and reducing the active area is really helpful to reduce the ΔIon of semiconductor devices and further improve the quality of semiconductor devices.

To sum up, in the method of the present invention, the size of the target gate structure in the semiconductor device is determined, and if the size of the target gate structure is within a specific range, it is easy to generate a mismatch issue (ΔIon is larger). Therefore, in order to avoid the above mismatch issue, the present invention will adjust the size of the active area, especially making the active area only partially overlaps with the target gate structure and does not overlap with other adjacent gate structures (the first gate structure and the second gate structure), it can effectively reduce the mismatch issue before and after forming the epitaxial layer of the semiconductor device. Therefore, the yield of semiconductor elements can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for reducing mismatch of semiconductor device patterns, comprising:

providing a substrate on which a plurality of mutually parallel gate structures are formed, wherein the plurality of gate structures at least comprise a target gate structure, and a first gate structure and a second gate structure which are respectively positioned at two sides of the target gate structure, wherein a channel length of the target gate structure is between 0.1 µm and 0.5 µm, and a channel width of the target gate structure is between 0.5 µm and 3 µm;

defining an active area in a computer system, wherein the method for defining the active area comprises the following steps:

defining an initial lithography area partially overlapping the target gate structure, the first gate structure and the second gate structure;

after the initial lithography area is defined, adjusting and reducing the area of the initial lithography area to define a second lithography area, wherein the second lithography area partially overlaps with the target gate structure but does not overlap with the first gate structure and the second gate structure, and the second lithography area is defined as the active area; and performing an etching step to transfer the pattern of the active area into the substrate to form a groove in the substrate.

2. The method according to claim 1, further comprising forming an epitaxial layer in the groove after the groove is formed.

3. The method according to claim 2, wherein the epitaxial layer does not contact the first gate structure and the second gate structure.

4. The method according to claim 2, wherein the epitaxial layer is made of SiGe.

5. The method according to claim 1, wherein there is no other gate structure included between the first gate structure and the target gate structure, and no other gate structure is included between the second gate structure and the target gate structure.

* * * * *